(12) United States Patent
Weiss et al.

(10) Patent No.: US 6,496,714 B1
(45) Date of Patent: Dec. 17, 2002

(54) RF-SAFE INVASIVE DEVICE

(75) Inventors: Steffen Weiss, Hamburg (DE);
Kai-Michael Lüdeke, Halstenbek (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/910,204

(22) Filed: Jul. 20, 2001

(51) Int. Cl.[7] .................................................. A61B 5/05
(52) U.S. Cl. ..................................................... 600/423
(58) Field of Search ................................. 600/423, 411, 600/422, 421, 420, 410, 407, 436; 324/307, 318; 436/173

(56) References Cited

U.S. PATENT DOCUMENTS

| | | | | |
|---|---|---|---|---|
| 5,303,707 A | * | 4/1994 | Young | 324/309 |
| 5,402,788 A | * | 4/1995 | Fujio et al. | 600/423 |
| 5,738,632 A | * | 4/1998 | Karasawa | 324/318 |
| 5,916,162 A | * | 6/1999 | Snelten et al. | 600/411 |
| 6,229,327 B1 | * | 5/2001 | Boll et al. | 324/761 |
| 6,339,716 B1 | * | 1/2002 | Sawada et al. | 600/365 |
| 6,397,094 B1 | * | 5/2002 | Ludeke et al. | 324/309 |
| 6,408,202 B1 | * | 6/2002 | Lima et al. | 324/307 |

* cited by examiner

*Primary Examiner*—Henry Bennett
*Assistant Examiner*—Daniel Robinson
(74) *Attorney, Agent, or Firm*—John Vodopia

(57) ABSTRACT

The invention sets forth an RF-safe invasive device which is intended to cooperate with a magnetic resonance imaging apparatus and which contains at least one long conductor for a specific purpose, e.g., the localization of the RF-safe device in an object under test. It is known that in such devices with long conductors during RF transmission of the magnetic resonance apparatus a standing RF wave along the conductors may build up which causes dangerous heating of the device and surrounding tissue. It is the object of the invention to provide a construction applicable to such devices such that the heating of the conductor and surrounding tissue is avoided. The RF-safe invasive device is therefore provided with at least one series element of controllable impedance incorporated into the long conductor where the impedance of the series element is controlled by a control unit such that during RF transmission the series elements subdivide the long conductor into sections substantially shorter than half the wavelength in tissue of the RF used.

17 Claims, 3 Drawing Sheets

RF-SAFE INVASIVE DEVICE

BACKGROUND OF THE INVENTION

The invention relates to invasive devices which are intended to cooperate with a magnetic resonance imaging apparatus. More particularly, the invention relates to an RF-safe invasive device arranged to be introduced into an object, where the invasive device is elongate shaped and contains at least one long conductor arranged in length to approach or exceed half a wavelength of the RF field generated in the object by operation of the magnetic resonance imaging apparatus.

Conventional invasive devices which include a conductor for cooperating with magnetic resonance imaging (MRI) apparatus are known in which, during RF transmission of the magnetic resonance apparatus, a standing RF wave may be generated within and in the neighborhood of the conductor, considerably. The standing wave may cause dangerous heating of the device and surrounding tissue. More particularly, the conventional arts teach two main groups of invasive devices incorporating long conductors. A first is exemplified by U.S. Pat. No. 5,318,025 (the '025 patent), incorporated herein by reference.

The '025 patent discloses an invasive device for use in interventional procedures, where the invasive device is guided to an organ via an opening in the body of a patient. To this end, RF fields and magnetic fields are applied so as to generate magnetic resonance signals of spins in a part of the body (tissue) where a distal end of the invasive device is situated. An RF micro ($\mu$)-coil attached to the distal end receives a magnetic resonance signal of spins in a part of the body in the vicinity of the RF $\mu$-coil. The signal received by the RF $\mu$-coil is transferred to the proximal end by means of an electrical connection and used to determine, in cooperation with the magnetic resonance apparatus, the position of the invasive device in the body of the patient (object) under test.

An example from the second group is PCT Patent No. WO 97/19362 (the '362 patent), commonly owned with the owner of the instant application, and incorporated herein by reference. The '362 patent discloses an MR system for interventional procedures, comprising an MR device and a catheter. The MR device is arranged to acquire images of part of an object. A particular portion of the catheter can be imaged in an MR image by providing a conductor loop which comprises two non-magnetic conductors situated at some distance from one another underneath the surface of the catheter. The conductor loop extends along the entire length of the catheter. By application and adjustment of a current through the loop, the homogeneity of the magnetic field of the MR device is affected with the result that the catheter shows up in the image as a dark trace. Thus it is possible to localize the catheter in the image.

Also known is U.S. Pat. No. 5,916,162 (the '162 patent), commonly owned with the owner of the instant application and incorporated herein by reference. The '162 patent discloses an invasive device for use in a magnetic resonance imaging apparatus and a means to minimize heating at and around the long conductor incorporated in the device. The '162 patented invasive device is provided with a hollow carrier which has a distal end and a proximal end, the electric connection extending through the carrier. The electrical connection is provided with an electrically conductive shield which extends over a distance from the distal end to the proximal end and has an electric resistance over said distance which is substantially higher than the electric resistance of the electric connection over the same distance. The electric shield comprises alternately electrically highly conductive portions and electrically less conductive portions.

The distance between the successive electrically less conductive portions is smaller than or equal to approximately ¼ wavelength of the RF field generated in the object by the magnetic resonance imaging apparatus in order to excite spins for imaging. The shield portions of lower electric conductivity in this case minimize the appearance of standing EM waves in the electric shield, which tends to reduce the development of heat in the electric shield (and the object) because the current induced in the electric shield is substantially smaller than the current which would be induced in the non-shielded connection.

The '162 patented invasive device, however, is not without drawbacks. For example, numerical estimations show that starting from a catheter with standard diameter a sufficient reduction of heat generation would require a shield of impracticable thickness, and keeping the diameter of a standard catheter fixed and reserving a sensible fraction of that diameter for its original functionality the shield would be too thin to be effective for heat reduction. Such a concept, therefore, is difficult to realize in practice, especially for small diameter catheters such as those used in cardiac- or stroke-related applications.

OBJECTS AND SUMMARY OF THE INVENTION

It is therefore an object of the invention to provide an RF-safe invasive device for introduction into an object being imaged by a magnetic resonance apparatus such that the localization of the device in the object may be known, and which overcomes the shortcomings of conventional invasive devices, e.g., a catheter.

It is another object of the present invention to provide a magnetic resonance imaging system which includes a magnetic resonance imaging apparatus which is constructed to operate with an RF-safe invasive device capable of being localized in an object being imaged without causing undue uncomfortability in the imaged object resulting from heating during imaging by the magnetic resonance imaging apparatus.

It is yet another object of the invention to provide an RF-safe invasive device equipped with at least one long conductor, for example, a wire loop, for introduction into an object being imaged by a magnetic resonance apparatus such that heating of the conductor and the surrounding tissue during RF transmission is avoided.

It is another object of the invention to provide an RF-safe invasive device which includes a wire loop which is divided into electrical sections in order to minimize induced current flowing in the wire loop when RF-transmission is 'ON'.

It is another object of the invention to provide an RF-safe invasive device which includes an electrical connection used for transmitting RF from the distal end to the proximal for localization or imaging, which connection is effectively divided into sections in order to avoid induced current flowing in the electrical connection when RF-transmission is 'ON'.

As mentioned above, the RF-safe invasive device of this invention operates with a magnetic resonance apparatus for imaging an object with the introduced invasive device. The magnetic resonance apparatus includes a first magnet system for generating a static magnetic field in the object, a plurality of gradient coils for generating gradient magnetic fields in the object, at least one RF coil for transmitting RF pulses to the object and for receiving RF signals from the object, and a control unit for controlling the gradient magnetic fields and the RF pulses in order to generate magnetic resonance imaging signals.

The introduced invasive device includes an elongate envelope constructed to have a proximal end and a distal end, where at least one long conductor is arranged within the elongate envelope for a specific purpose. For example, for carrying a direct current for catheter localization, such as disclosed in the '362 patent, or for imaging and/or localization as disclosed in the '025 patent, transmitting a signal generated by a sensor, etc.

Into each long conductor at least one series element of controllable impedance is incorporated which can effectively divide the long conductor into short electrical sections at times in which RF signals are generated by the magnetic resonant imaging apparatus. The controllable series element may be included to avoid formation of standing waves in the long conductor, and to therefore minimize heating in the long conductor and consequential uncomfortability in the object being imaged.

In a second embodiment, the RF-safe invasive device of this invention may be introduced into an object being imaged with a magnetic resonance imaging apparatus, the localization of the device in the object being monitored during examination by the MRI apparatus. The invasive device includes an elongate envelope constructed with a proximal end and a distal end, a wire loop arranged within the elongate envelope for generating a locating signal such as that described in the '362 patent and an electric connection for coupling the wire loop to a control unit.

The wire loop includes at least one circuit element which is activated by a control unit at times during which RF signals are generated by the magnetic resonant imaging apparatus in order to avoid heating in the wire loop and consequential uncomfortability in the object being imaged. The loop generates the locating signal during a time in which the control unit causes DC to be provided to the wire loop.

In a third embodiment, the invention comprises a magnetic resonance system (for imaging an object) constructed for operation with an introduced RF-safe invasive device such that the localization of the invasive device may be determined. The magnetic resonance system includes a magnetic resonance apparatus and an RF-safe invasive device constructed in accordance with the principles disclosed herein. The magnetic resonance apparatus may be any MRI device known to those skilled in the art to include a first magnet system for generating a static magnetic field in the object to be imaged, a plurality of gradient coils for generating gradient magnetic fields in the object, at least one RF coil for transmitting RF pulses to the object and for receiving RF signals from the imaged object, and a control unit for controlling the gradient magnetic fields and the RF pulses in order to generate magnetic resonance imaging signals.

The RF-safe invasive device includes an elongate envelope constructed with a proximal end and a distal end, a wire loop arranged within the elongate envelope for generating a locating signal, and an electric connection for coupling the wire loop to a control unit. The wire loop includes at least one circuit element which is activated by the control unit at times in which RF signals are generated by the magnetic resonant imaging apparatus to avoid formation of standing waves in the wire loop and consequential heating in the wire loop leading to uncomfortability in the object being imaged as a result of the heating. The loop generates the locating signal during a time in which the control unit causes DC to be provided to the wire loop.

BRIEF DESCRIPTION OF THE DRAWINGS FIGURES

The above and other more detailed aspects of the invention will be described in detail hereinafter, by way of example, with reference to the following drawing figures.

DETAILED DESCRIPTION OF THE INVENTION

Figure 1:
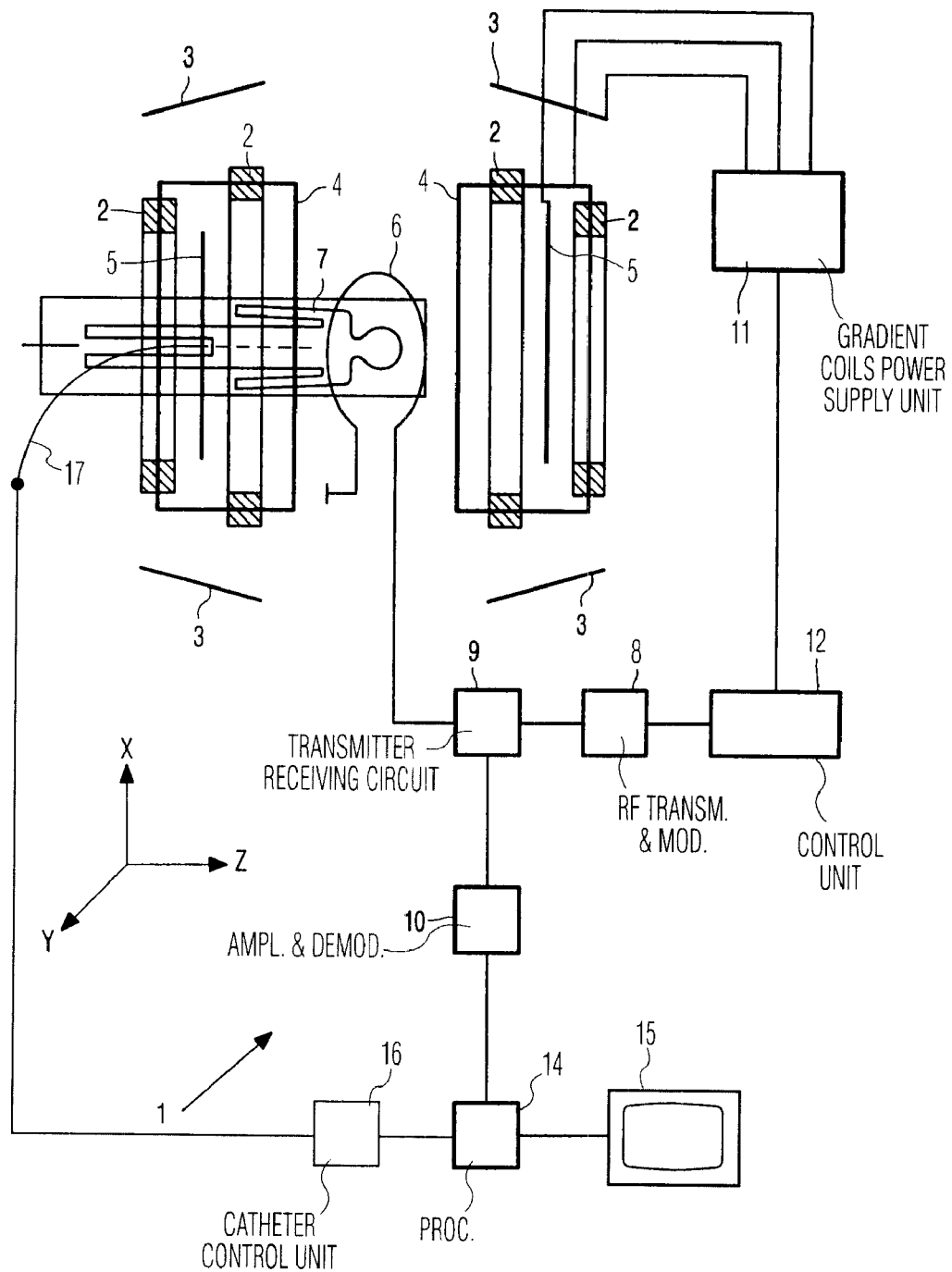
FIG. 1 is a schematic diagram of a conventional magnetic resonance imaging apparatus including an RF-safe invasive device of this invention.

FIG. 1 shows a magnetic resonance imaging apparatus which includes a first magnet system 2 for generating a static magnetic field. The Z direction of the coordinate system shown corresponds by convention to the direction of the static magnetic field in the magnet system 2. The magnetic resonance imaging apparatus also includes several gradient coils 3, 4, 5 for generating additional magnetic fields having a gradient in the X, the Y, and the Z directions. The gradient coils 3, 4, 5 are fed by a power supply unit 11. The magnet system 2 encloses an examination space which is large enough to accommodate a part of an object to be examined, for example a patient 7. An RF transmitter coil 6 serves to generate RF fields and is connected, via a transmission/receiving circuit, to an RF transmitter and modulator 8. The RF transmitter coil 6 is arranged around or on a part of the patient 7 in the examination space.

There is also provided a receiving coil which is connected to a signal amplifier and demodulation unit 10 via the transmission/receiving circuit 9. The receiving coil may be the same coil as the transmitter coil 6. A control unit 12 controls the RF modulator 8 and the power supply unit 11 in order to generate special pulse sequences which contain RF pulses and gradients. After excitation of spins by means of RF pulses to be generated in a part of the body which is situated in the examination space, a magnetic resonance signal can be received by means of the receiving coil 6. The information of the magnetic resonance signal derived from the demodulation unit 10 is applied to a processing unit 14.

The processing unit 14 processes the information into an image by transformation. This image can be displayed, for example on a monitor 15. FIG. 1 also shows an RF-safe invasive device (catheter) 17, as an example of an RF-safe invasive device to which the invention relates. The RF-safe invasive device 17 of the invention may be slid into the patient 7, and is controlled by a (catheter) control unit 16. The RF-safe invasive device (catheter) 17 is shown in greater detail in FIG. 2.

Using suitably chosen RF pulses and magnetic gradient fields, the magnetic resonance imaging apparatus generates a magnetic resonance signal. An RF field is generated during the generating of magnetic resonance signals by the RF coil 6. This RF field induces a current in the electric connection (not shown in FIG. 1) of the RF-safe catheter 17 within the patient 7. The RF-field induced in the catheter during RF transmission normally causes RF standing waves to build up in the wire(s) of the invasive device. That is, wire(s) with lengths greater than half a wavelength or longer tend to realize high current at a position approximately ¼ wavelength from the distal end and repeating at ½ wavelength intervals (i.e., at standing wave peaks). The high current causes heating which is uncomfortable for the patient and therefore undesired.

The inherent design of the RF-safe invasive device of this invention acts to eliminate or avoid said high currents. Put another way, an RF field is generated in the examination space for the generation of magnetic resonance signals by the RF coil 6. This RF field creates RF standing waves in and along wires ( of the invasive device of the prior art ) with a length of ½ a wavelength or more, such that the corresponding induced current in the wire has maxima at positions approximately ¼ wavelength from the distal end and repeating at ½ wavelength intervals.

The standing wave pattern is also accompanied by increased electrical RF-fields at the distal end and repeating at ½ wavelength intervals. Both the current and the electrical field may reach amplitudes high enough to cause heating which is uncomfortable for the patient and therefore undesired. The inherent design of the RF-safe invasive device of this invention acts to eliminate said high currents and excessive electrical fields by preventing the formation of said standing waves.

Figure 2:
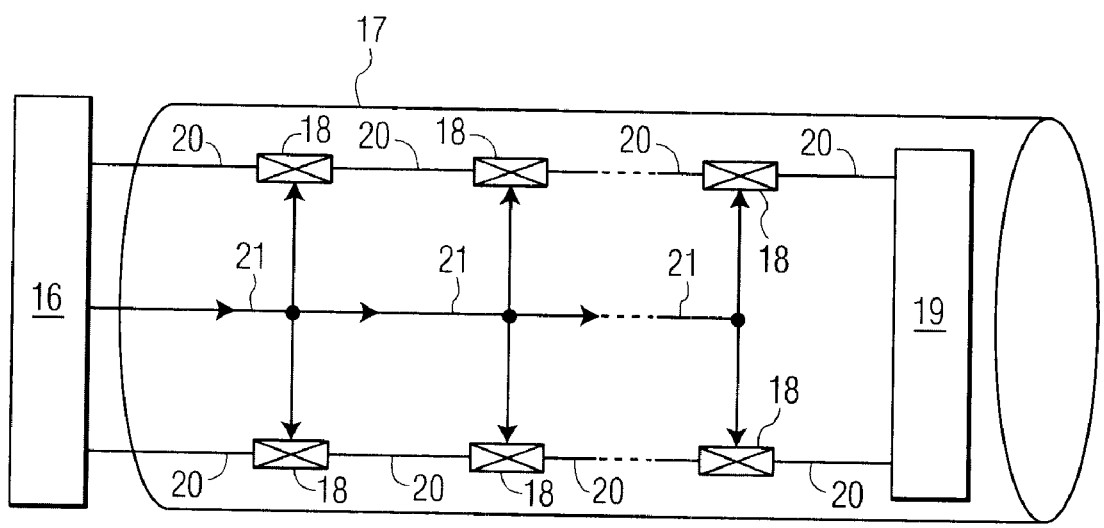
FIG. 2 is a schematic diagram depicting one embodiment of an RF-safe invasive device of this invention.

FIG. 2 shows the embodiment of the RF-safe invasive device 17 of FIG. 1 in greater detail. The RF-safe invasive device or catheter 17 is shown therein to include two long conductors 20 which connect the control unit 16 to an optional additional element 19 to, for example, receive an MR-signal, measure a quantity like temperature, etc. Long conductors 20 include series elements 18, which series elements subdivide the long conductor into electrical sections which are substantially shorter electrically than half a wavelength in tissue of the RF used in the magnetic resonance imaging apparatus.

In this embodiment, the series elements act as switches which can be opened or closed. The switches (series elements) are controlled by control unit 16, which controls the series elements via control paths 21. The control unit 16 consists of a voltage source $U_{rev}$, a current source $I_{DC}$ and a switch 24 (see FIG. 3). As will be understood to those skilled in the art, control paths 21 may take the form of an electrical, an optical or any other type of means for communicating control signals.

The control unit 16 itself is controlled by the magnetic resonance imaging apparatus such that the series elements (switches), and thus the subdivision, are activated during RF transmission by the magnetic resonance imaging apparatus. Consequently, the resulting electrical sections are too short to support the formation of a standing wave and thus heating in those conductors and surrounding tissue is avoided during the RF transmission.

Figure 3:
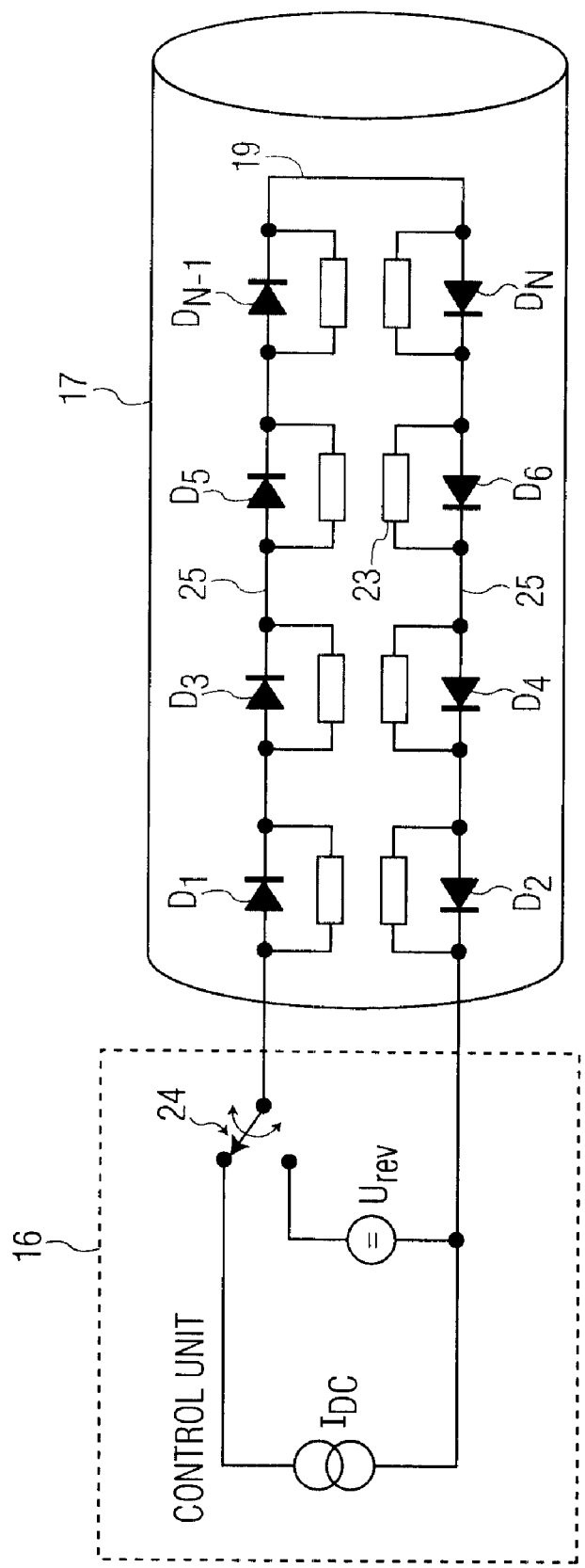
FIG. 3 is a schematic diagram depicting another embodiment of an RF-safe invasive device of this invention.

FIG. 3 shows another embodiment of an RF invasive device (catheter) 17 of this invention. The fundamental or non-novel operation of the device is based on the operation of the '362 patented device. The novel feature of the embodiment resides in the fact that the two long conductors 20 (FIG. 2), which are constructed to form a wire loop 25, now contain series elements 18, and an optional additional element 19 (FIG. 2), which may also be utilized therein as a termination or electrical connection (i.e., a simple wire or land). That is, element 19 (of FIG.2) may be reduced to a simple wire connection. The function of the control path 21 (FIG. 2) is performed by the wire loop 25 as well. The series elements 18 (FIG. 2) are realized by diodes $D_1$–$D_N$ Diodes $D_1$ through $D_N$ are placed in the wire loop repeating at ¼ wavelength or shorter intervals. When series elements 18 are placed at ½ wavelength intervals new resonating elements (½ wavelength dipoles) are created supporting the shortest standing wave possible. There are high currents at the centers and high electric fields at both ends of all subsections. For this reason, the series elements 18 have to be placed at substantially shorter intervals, preferably a ¼ wavelength or less. In a variation of the embodiment, the diodes also may be connected to corresponding resistors 23 in parallel Those skilled in the art will realize that the essential series elements are the diodes. During RF transmission, switch 24 is operated to connect the loop to $U_{rev}$, which reverse biases the diodes. If said series elements were all exactly identical under all environmental circumstances (e.g., temperature), the optional resistors could be omitted. The optional resistors ensure that $U_{rev}$ is evenly distributed among the diodes irrespective of their tolerances. The resistors' resistance values are chosen lower than that of a typical diode in reverse bias in order that they mainly determine the voltage across the diode. The reversed biased diodes have an extremely high impedance, effectively breaking the long wires into several electrical segments too short to support the formation of standing waves. That is, utilizing such an inventive concept avoids a risk of tissue heating due to induced high currents or excessive electrical fields along the wire loop 25.

At times when RF is not being transmitted by the imaging apparatus, switch 24 is controlled by the control unit to switch the wire loop connection from $U_{rev}$ to $I_{DC}$, a current source. The current $I_{DC}$ is in a forward bias direction with respect to the diodes so that it is driven through the wire loop to produce the desired field inhomegeneity used for invasive device visualization (localization). Instead of the catheter, another invasive device can also be used in this embodiment, for example a guide wire, a laparoscope or a biopsy needle, not only for the present embodiment and its described variations, but for any device constructed according to the inventive concepts described herein.

At times when RF is not being transmitted by the imaging apparatus, switch 24 may be operated to connect loop 25 to a current source $I_{DC}$. The current $I_{DC}$ is in a forward bias direction with respect to the diodes such that the wire segments are effectively reconnected by the low 'ON'-resistance of the diodes to restore the original loop. The same $I_{DC}$ produces the desired field inhomegeneity which serves to localize the catheter, as is described in the '362 patent. Forward bias voltage is applied, making the impedance of the diodes low. Consequently a current flows through the loop. The current and the loop may be designed such that the effect described in the '362 patent is produced.

The reader should note that the embodiments described herein are for exemplary purposes only, and are not meant to limit the scope and spirit of the invention at all, which scope and spirit will be limited only by the claims appended hereto.

What is claimed is:

1. An RF-safe invasive device comprising at least one long conductor having a length which is greater than or equal to half the wavelength of the applied RF field generated an the object to be imaged by the RF signal energy transmitted during operation of a magnetic imaging apparatus used in conjunction with said RF-safe invasive device, wherein said device is to be introduced into the object being imaged and suppresses uncomfortable and dangerous heating of the device and the surrounding the object during the RF transmission, the RF-safe device further comprising:

at least one series element of controllable impedance incorporated into said at least one long conductor, wherein said at least one series element is controlled by control signals to effectively subdivide the long conductor in electrical sections, said electrical sections being substantially shorter than half a wavelength of the RF applied by the magnetic resonance imaging apparatus as found in the tissue of the object being imaged, wherein heating in the at least one long conductor is avoided;

a control unit defines one of a low ("on") and a high impedance ("off") state of the series elements by generation of said control signals, wherein the control unit is controlled by the magnetic resonance imaging apparatus such that the series elements are operated in said high impedance state during RF transmission; and a control path that connects the control unit to the series elements.

2. The RF-safe invasive device as set forth in claim 1, wherein said control path may comprise one of an electrical, an optical, pneumatic, RF transmitted, inductive, magnetic and sonic communication path.

3. The RF-safe invasive device set forth in claim 1, wherein the at least one long conductor further includes an additional element with which it may communicate.

4. The RF-safe invasive device set forth in claim 3, wherein the additional element may include at least one of (1) a short to electrically connect conductors at an end of said at least one long conductor, (2) an electronic coupling to a medical imaging system, and (3) an electronic coupling to a non-imaging medical system.

5. The RF-safe invasive device of claim 4, wherein said additional element includes an MR imaging system.

6. The RF-safe invasive device set forth in claim 1, wherein two long conductors form a wire loop, wherein the series elements each consist of a diode and an optional resistor, wherein the control unit consists of a voltage source $U_{rev}$, a current source $I_{DC}$ and a switch which has two operating states.

7. The RF-safe invasive device set forth in claim 6, wherein said first operating state supports that during RF transmission, the switch connects the loop to $U_{rev}$ reverse biasing the diodes such that their high-impedance ("off") state effectively breaks the loop avoiding heating and the second low impedance ("on") operating state supports that during other times the switch may connect the loop to a current source $I_{DC}$ forward biasing the diodes such that said low-impedance state effectively reconnects the loop sections and the direct current produces a field inhomegeneity for localizing the catheter.

8. An RF-safe invasive device comprising at least one long conductor having a length which is greater than or equal to half the wavelength of the applied RF signal generated in an object being imaged using RF energy transmitted during operation of a magnetic imaging apparatus, wherein said RF-safe invasive device is intended for introduction into an object being imaged and suppresses uncomfortable and dangerous heating of the device and the surrounding object during RF transmission by the magnetic resonance imaging apparatus, the RF-safe invasive device, comprising:

at least said one long conductor;

at least one series element of controllable impedance incorporated into said at least one long conductor, wherein said at least one series element is controlled by control signals to effectively subdivide the long conductor in electrical sections, said electrical sections being substantially shorter than half a wavelength the RF field generated in the object tissues by the magnetic resonance imaging apparatus, wherein heating in the at least one long conductor is avoided;

a control unit that activates and deactivates the series elements by generation of said control signals, wherein the control unit is controlled by the magnetic resonance imaging apparatus such that the series elements are activated by the control unit utilizing a reverse bias voltage during RF transmission; and wherein the control unit is controlled by the magnetic resonance imaging apparatus such that the series elements are activated by the control unit such that the conductor is subdivided into electrically short conductors utilizing a forward biasing current $I_{DC}$ which is adjusted such that said current operates to render a location of the RF-safe invasive device clear to a viewer of the magnetic resonance imaging apparatus during non-RF transmission times.

9. The RF-safe invasive device of claim 8, wherein an element at the tip of the device contains a coil for reception of MR signals, which coil is connected to an MR receiver by the long conductors forming an RF transmission line, and wherein the element at the tip of the device additionally contains a capacitor in series with the coil to block the direct current from the coil which would otherwise disturb the signal reception and a DC bypass which displays an impedance commensurate with the RF frequencies at the distal end of the transmission line to pass direct current from the first to the second conductor without substantial degradation of the RF signal received by the coil.

10. An RF-safe invasive device to be introduced into an object being imaged with a magnetic resonance imaging apparatus, the location of the device being monitored, comprising:

a wire loop arranged within the device for carrying a direct current for generation of a local magnetic field for catheter localization;

an electric connection for coupling the wire loop to a control unit, wherein the wire loop includes at least one circuit element which is brought to a high-impedance "off"state by said control unit by establishing a reverse bias at said at least one circuit element at times in which RF signals are generated by the magnetic resonant imaging apparatus to minimize heating in the wire loop and consequential uncomfortability in the object being imaged, and wherein the loop generates the locating signal during a time in which the control unit causes DC to be provided to the wire loop.

11. The RF-safe invasive device set forth in claim 10, wherein the wire loop is disposed at an invasive end of the catheter.

12. The RF-safe invasive device set forth in claim 10, wherein the control unit causes a DC to be provided to the wire loop to generate the local magnetic field during a time at which the magnetic resonance apparatus is not transmitting RF signals.

13. The RF-safe invasive device set forth in claim 10, wherein the wire loop includes at least one diode as said circuit element.

14. The RF-safe invasive device set forth in claim 10, wherein the electrical connection comprises coaxial conductors.

15. A magnetic resonance apparatus for imaging an object with an introduced RF-safe invasive device such that the location of the RF-safe invasive device is known, comprising:

a first magnet system for generating a static magnetic field in the object, a plurality of gradient coils for generating gradient magnetic fields in the object, at least one RF coil for transmitting RF pulses to the object and for receiving RF signals from the object, and a control unit for controlling the gradient magnetic fields and the RF pulses in order to generate magnetic resonance imaging signals, wherein said introduced RF-safe invasive device comprises:

a wire loop arranged within the device for carrying a direct current for generation of a local magnetic field for catheter localization;

an electric connection for coupling the wire loop to a control unit, wherein the wire loop includes at least one circuit element which is brought to a high impedance ("off") state by said control unit by establishing a reverse bias at said at least one circuit element at times in which RF signals are generated by the magnetic resonant imaging apparatus to minimize heating in the wire loop and consequential uncomfortability in the object being imaged, and wherein the loop generates the locating signal during a time in which the control unit causes DC to be provided to the wire loop.

16. The magnetic resonance apparatus as set forth in claim 15, wherein the control unit causes a DC to be provided to the wire loop to generate the local magnetic field during a time at which the magnetic resonance apparatus is not transmitting RF signals.

17. The magnetic resonance apparatus as set forth in claim 15, wherein the wire loop includes at least one diode as said circuit element.

* * * * *